United States Patent
Dillon (10) Patent No.: US 6,590,422 B1
(45) Date of Patent: Jul. 8, 2003

(54) LOW VOLTAGE DIFFERENTIAL SIGNALING (LVDS) DRIVERS AND SYSTEMS

(75) Inventor: Christopher Daniel Dillon, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/112,846

(22) Filed: Mar. 27, 2002

(51) Int. Cl.[7] ...................... H03K 19/0175; H03M 1/36
(52) U.S. Cl. ............................ 326/86; 326/30; 326/83; 326/82; 327/108; 327/87; 327/67; 330/253; 330/258; 341/156; 341/159
(58) Field of Search .......................... 326/82, 83, 86, 326/30, 115, 127; 327/108, 87, 67; 330/258, 253; 341/156, 161–163

(56) References Cited

U.S. PATENT DOCUMENTS

| | | | |
|---|---|---|---|
| 5,187,448 A | * | 2/1993 | Brooks et al. ............... 330/258 |
| 5,977,796 A | | 11/1999 | Gabara |
| 6,005,438 A | | 12/1999 | Shing |
| 6,111,431 A | | 8/2000 | Estrada |
| 6,246,262 B1 | * | 6/2001 | Morgan et al. ............... 326/81 |
| 6,369,621 B1 | * | 4/2002 | Tinsley et al. .............. 327/108 |
| 6,404,374 B1 | * | 6/2002 | Yu et al. ...................... 341/159 |

OTHER PUBLICATIONS

Jordanger, Rick, "A Comparison of LinBiCMOS and CMOS Process Technology in LVDS Integrated Circuits", Texas Instruments, Application Report SLLA065, Mar. 2000.

* cited by examiner

Primary Examiner—Michael Tokar
Assistant Examiner—Vibol Tan
(74) Attorney, Agent, or Firm—Koppel, Jacobs, Patrick & Heybl (57) ABSTRACT

LVDS drivers and analog-to-digital (ADC) systems are provided which facilitate easy alteration (e.g., replacement of a selectable resistor $R_{sel}$) of differential current levels and differential voltages in response to altered loads. These drivers and systems maintain common-mode levels in the loads which are unaffected by alterations in the loads and their associated differential current and voltage levels.

40 Claims, 3 Drawing Sheets

LOW VOLTAGE DIFFERENTIAL SIGNALING (LVDS) DRIVERS AND SYSTEMS

BACKGROUND OF THE INVENTION

1. Field of the Invention

The present invention relates generally to low voltage differential signaling (LVDS) structures.

2. Description of the Related Art

LVDS is a data signaling technology that provides differential current signals for high-rate data transmission. Because noise is generally equally coupled onto differential signal paths, it is substantially rejected by a remote receiver which differentially receives the LVDS signals. Accordingly, LVDS differential transmission is less susceptible to common-mode noise than typical single-ended transmission techniques. Because LVDS drivers generate low-level differential current signals, their power consumption is reduced from conventional single-ended transmission systems and is almost flat regardless of the data rate.

LVDS technology is currently standardized in the ANSI/TIA/EIA-644 Standard of the Telecommunications Industry Association/Electronics Industries Association (TIA/EIA) and in the IEEE 1596.3 Standard of the Institute for Electrical and Electronics Engineering (IEEE).

Although its low-noise, low-power characteristics make LVDS particularly suited for driving remote receivers, currently-available LVDS systems generally fail to provide means to easily accommodate different loads and readily realize selected differential currents and voltages with these loads while still maintaining a standardized common-mode level.

BRIEF SUMMARY OF THE INVENTION

The present invention is directed to LVDS drivers and analog-to-digital (ADC) systems which facilitate easy alteration (e.g., replacement of a selectable resistor $R_{sel}$) of differential current levels and differential voltages in response to altered loads. In addition, these drivers and systems maintain common-mode levels in the loads which are unaffected by alterations in the loads and their associated differential current and voltage levels. These features are realized with feedback signals from high-resistance feedback resistors that are coupled across LVDS circuit bridges.

The novel features of the invention are set forth with particularity in the appended claims. The invention will be best understood from the following description when read in conjunction with the accompanying drawings.

DETAILED DESCRIPTION OF THE INVENTION

Figure 1:
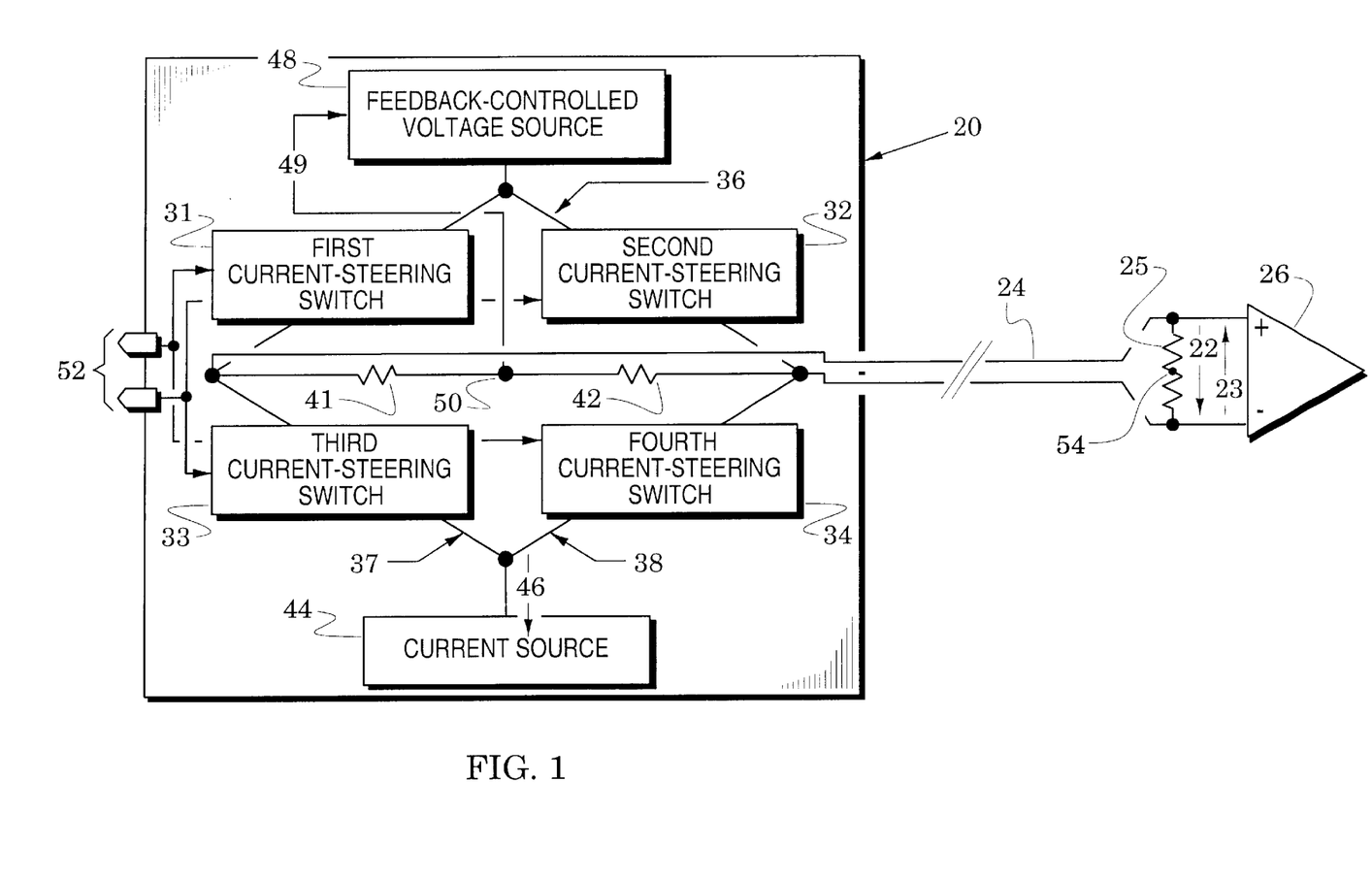
FIG. 1 is a block diagram of an LVDS driver system embodiment of the present invention.
Figure 2:
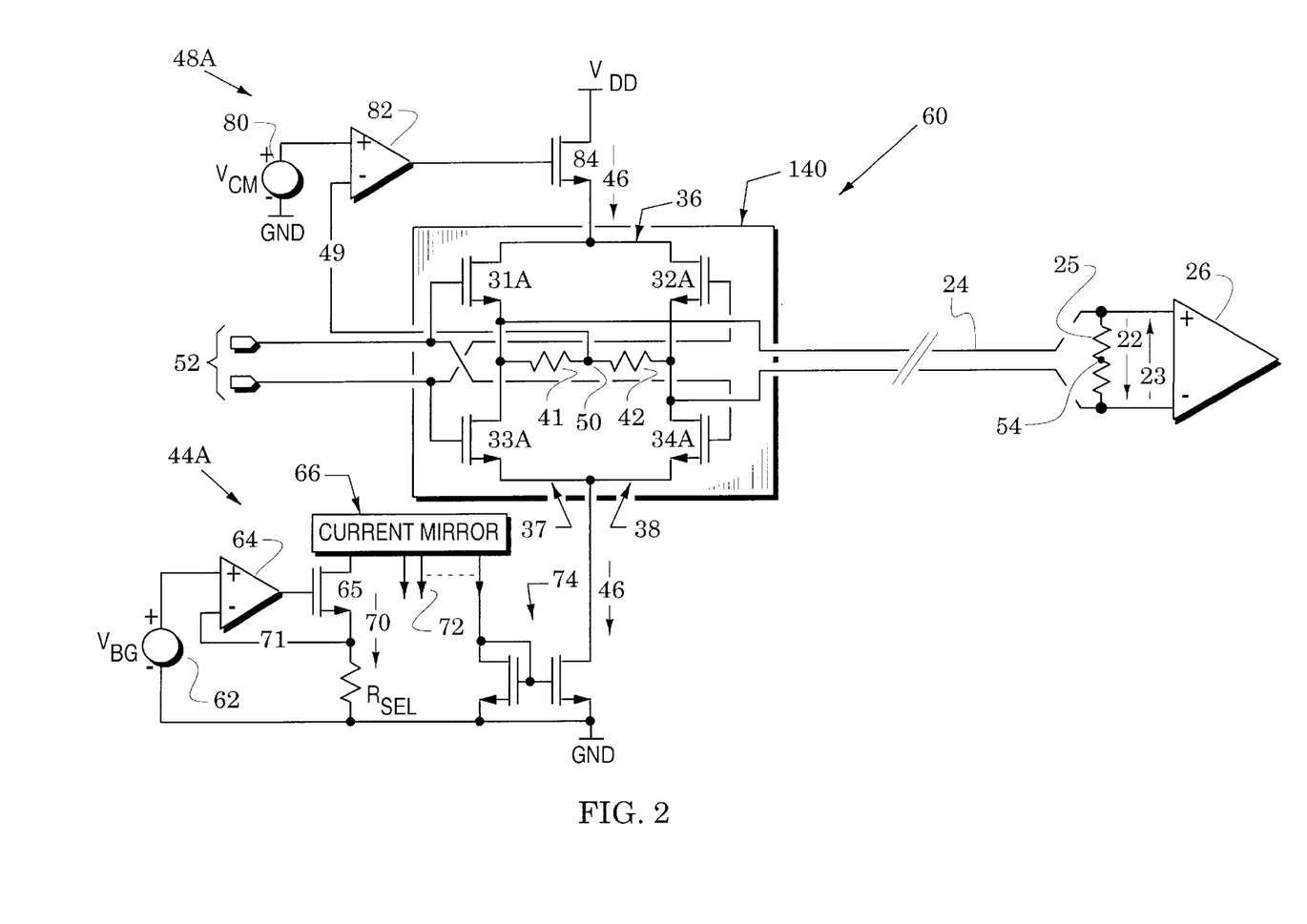
FIG. 2 is a schematic of another LVDS driver system embodiment.
Figure 3:
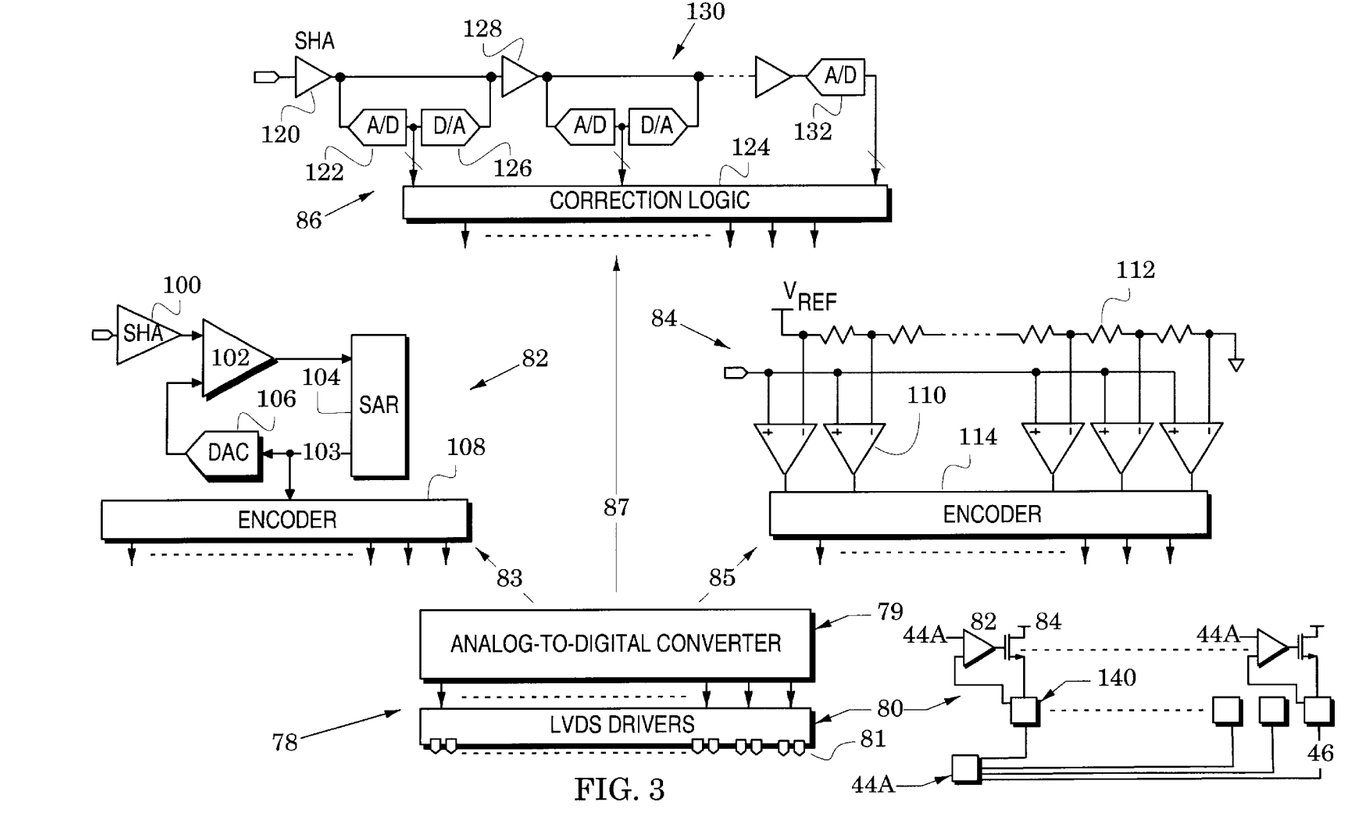
FIG. 3 is a block diagram of analog-to-digital converter systems that are realized with the driver systems of FIGS. 1 and 2.

LVDS driver embodiments are shown in FIGS. 1 and 2 and ADC system embodiments are shown in FIG. 3. LVDS drivers of these embodiments drive differential current signals through remote loads. A user of a set of these LVDS drivers may alter the loads and then alter the amplitude of the differential currents with a single selectable resistor $R_{sel}$ to thereby alter differential voltages across the loads. In a significant driver feature, these alterations can be made without affecting a common-mode voltage $V_{CM}$ of the load resistors.

Loads of LVDS drivers are preferably resistive loads which are typically realized, for example, with resistors or with appropriately-biased semiconductor devices (e.g., metal-oxide semiconductor (MOS) transistors and bipolar junction transistors). Accordingly, all loads (e.g., load 54 in FIG. 1) are indicated with resistor symbols in FIGS. 1–3.

Attention is now directed to FIG. 1 which illustrates an LVDS driver system embodiment 20 that drives differential current signals 22 and 23 through a transmission line 24 and through a (typically) remote load 25 that terminates a high-input-impedance receiver 26. The driver includes first, second, third and fourth current-steering switches 31, 32, 33 and 34 that are serially-connected to form a circuit bridge 36.

In particular, the first and third switches 31 and 33 are respectively coupled to the top and bottom of a first side 37 of the circuit bridge and the second and fourth switches 32 and 34 are respectively coupled to the top and bottom of a second side 38 of the circuit bridge. First and second substantially-equal feedback resistors 41 and 42 are serially connected across the circuit bridge 36.

A current source 44 is coupled to provide a bridge current 46 to one of the top and bottom of the circuit bridge 36. A feedback-controlled voltage source 48 responds to a feedback signal 49 from a circuit junction 50 between the first and second feedback resistors 41 and 42. With the aid of this feedback signal, the voltage source 48 provides a voltage to the other of the top and bottom of the circuit bridge that maintains the circuit junction 50 at a common-mode level (e.g., 1250 millivolts). Although, in the specific driver of FIG. 1, the current source 44 is coupled to the bottom of the circuit bridge 36 and the voltage source 48 provides a voltage to the top of the circuit bridge, other driver embodiments may reverse this order.

In operation of the LVDS driver 20, a differential input signal (e.g., a complementary metal-oxide semiconductor (CMOS) signal) is applied at a differential input port 52 which couples one side of the differential signal to operate the first and fourth switches 31 and 34 and couples the other side of the differential signal to operate the second and third switches 32 and 33. In response to one state of the differential input signal 52, the first and fourth switches close to steer the bridge current 46 over the transmission line 24 and along a first path 22 through the load 25. In response to a second state of the differential input signal 52, the second and third switches close to steer the bridge current 46 over the transmission line 24 and along a second path 23 through the load. In the above operation, substantially all of the bridge current 46 flows through the load 25 because the resistance of the feedback resistors 41 and 42 is preferably set significantly higher than that of the load.

In both states, the feedback signal 49 from the circuit junction 50 enables the feedback-controlled voltage source 48 to maintain a common-mode level of the circuit junction 50 at a selected value. Because the load 25 is also coupled across the circuit bridge 36, the voltage at a midpoint 54 of the load will also be maintained at the selected value during both of the differential input signal states. It is noted that this control of the common-mode level is independent of the value of the bridge current 46 that is provided by the current source 44, i.e., the differential currents along paths 22 and 23 can be varied without disturbing control of the load's common-mode level.

Attention is now directed to FIG. 2 which shows a schematic of another driver system embodiment 60 which further enhances an understanding of the teachings of the invention. The driver 60 includes elements of the driver 20 of FIG. 1 with like elements indicated by like reference numbers.

In the driver 60, the first, second, third and fourth current-steering switches are specifically realized as n-channel CMOS transistors 31A, 32A, 33A and 34A and the input port 52 couples differential input signals to the gates of these transistors. The current source 44 of FIG. 1 is realized as a current source embodiment 44A which includes a selectable resistor $R_{sel}$, a voltage source 62, a differential amplifier 64, a coupling transistor 65 and a current mirror 66. Preferably, the voltage source 62 is a band-gap voltage source that provides a band-gap voltage $V_{BG}$ (e.g., a voltage on the order of 1250 millivolts) which is substantially constant over a wide environmental temperature range.

The current source 44A controls the magnitude of the bridge current 46 in response to the resistance of the selectable resistor $R_{sel}$ and to the band-gap voltage $V_{BG}$. In particular, the coupling transistor 65 is biased by the differential amplifier 64 to drive a bias current 70 through the selectable resistor $R_{sel}$ and thereby generate a bias voltage 71 which is fed back to the negative input of the differential amplifier.

A feedback-controlled amplifier system is thus formed which controls the magnitude of the bias current 70 in response to the difference between the bias voltage 71 and the band-gap voltage $V_{BG}$. The high gain of the differential amplifier forces the difference between the voltages at its negative and positive input ports (the bias voltage 71 and the band-gap voltage $V_{BG}$) to be substantially zero so that the bias voltage across the selectable resistor $R_{sel}$ is controlled to be the band-gap voltage $V_{BG}$ and, accordingly, the bias current 70 is controlled to be $V_{BG}/R_{sel}$.

The current mirror 66 has a plurality of current taps 72 and mirrors the bias current 70 at its input to each of these current taps. In the driver 60, one of these mirrored currents is mirrored by a current mirror 74 (which has a diode-connected transistor coupled to a current transistor) to thus provide the bridge current 46. The current mirror 74 is preferably configured (e.g., with selected source areas) to have a current gain N. Thus, the currents at the current taps 72 of the current mirror 66 are reduced from the bridge current 46 by a factor of N to significantly reduce power consumption in the driver 60.

The feedback-controlled voltage source 48 of FIG. 1 is realized in the driver 60 as an embodiment 48A which includes a common-mode voltage source 80, a differential amplifier 82 and a coupling transistor 84 which carries the bridge current 46 that is provided by the current source 44A. The circuit junction 50 between the first and second feedback resistors 41 and 42 is coupled to the negative input port of the differential amplifier 82 and the common-mode voltage source 80 is coupled to the positive input port.

In operation of the feedback-controlled voltage source 48A, the common-mode voltage source 80 provides a common-mode voltage $V_{CM}$ and the high gain of the differential amplifier 82 and feedback action through the coupling transistor 84 causes the voltage of the feedback signal 49 to substantially equal the common-mode voltage $V_{CM}$. In particular, voltage drops across the coupling transistor 84 are altered until the voltage of the circuit junction 50 (and, hence, the voltage of the midpoint 54 of the load 25) substantially equals the common-mode voltage $V_{CM}$. In a significant feature of the driver 60, the load 25, the selectable resistor $R_{sel}$ and the bridge current 46 can be altered without affecting the common-mode voltage $V_{CM}$ at the midpoint 54 of the load 25.

In a different driver embodiment, the common-mode voltage source 80 of FIG. 2 is eliminated and the positive input of the differential amplifier 82 simply receives a band-gap voltage $V_{BG}$ from the voltage source 62 of the feedback-controlled current source 44A. In this embodiment, the common-mode voltage of the midpoint 54 of the load 25 is controlled to a nominal voltage on the order of 1250 millivolts. If the load 25 has a nominal value of 100 ohms, a nominal differential voltage of 350 millivolts across the load can be realized with a selected resistor $R_{sel}$ that causes the bridge current 46 (which is given by $1250N/R_{sel}$ wherein N is the current gain of the current mirror 74) to have a nominal value of 3.5 milliamperes.

A user of the LVDS driver 60 may select different resistances for the load 25 to realize various operational goals (e.g., an improved impedance match with the transmission line 24). When the driver 60 is realized as an integrated circuit, the selectable resistor $R_{sel}$ is preferably positioned externally to the integrated circuit so that its resistance may also be easily selected by the user. Thus, the bridge current 46 can be easily altered from a nominal value to realize any desired differential voltage across the selected load. In other driver embodiments, for example, the resistor $R_{sel}$ can be a programmable resistor that is programmed (e.g., by a digital-to-analog converter (DAC)) to facilitate circuit corrections (e.g., to compensate for impedance mismatches or temperature effects).

As modern ADCs process analog signals to realize greater resolution (greater numbers of digital bits) and higher speeds, their output samples per second correspondingly increase. It has been found that when the samples per second reach critical rates (e.g., on the order of 100 mega-samples per second (MSPS)), it becomes increasingly difficult to transport them over off-chip transmission lines, i.e., to transport them away from ADC integrated circuits.

Driver systems of the present invention, however, are suited for driving these transmission lines at much higher rates with differential current signals. In addition, because the amplitude of these differential currents is reduced (e.g., to 350 milliamperes) from conventional driver systems (e.g., rail-to-rail CMOS drivers), less noise is generated and fed back through parasitic capacitances to the front end of the ADC.

Accordingly, the ADC system 78 of FIG. 3 preferably supplements a conventional ADC 79 with an LVDS driver system 80 that is similar to the driver systems 20 and 60 of FIGS. 1 and 2. Each digital bit from the ADC is thus represented by differential currents similar to those through the paths 22 and 23 of FIG. 2 and these currents are then provided at a pair 81 of pins of the LVDS driver system to which a transmission line (24 in FIG. 2) can be coupled. A pair 81 of pins is provided for each digital bit that is generated by the pipelined ADC 82.

The ADC 79 can be realized as various specific ADC structures which include a successive approximation ADC 82, a flash ADC 84 and a pipelined ADC 86 as respectively indicated in FIG. 3 by realization arrows 83, 85 and 87.

In the successive approximation ADC 82, an analog input signal is sampled with a sample-and-hold amplifier (SHA)

100 and the resulting samples passed to one input of a comparator 102. In response to digital command signals 103 from a successive-approximation register (SAR) 104, a DAC 106 provides analog approximation signals to another input of the comparator 102.

With feedback decisions from the comparator 102, the SAR typically determines the most significant bit (MSB) initially and then proceeds to vary its digital command signals 103 to successively determine the remaining bits. At the end of this successive process, the final digital command signals 103 are processed to the converted digital signal by an encoder 108 and passed to the LVDS driver system 80.

In the flash ADC 83, an analog input signal is applied to a string of comparators 110 which each receive a respective reference signal from a ladder of serially-connected resistors 112. The decisions of the comparators 110 is coupled to an encoder 114 that provides the converted digital signal to the LVDS driver system 80.

The pipelined ADC 86 samples analog signals with a SHA 120 and converts the sampled signals to MSBs with an ADC 122 (e.g., a flash ADC). These MSBs are coupled to a correction logic 124 and are also converted to a corresponding analog signal in a DAC 126. The corresponding analog signal is subtracted from the sampled signals to produce an analog residue signal that is gained up in an amplifier 128 and passed to a succeeding conversion stage 130. At the end of this process, a final ADC 132 generates the least significant bits and passes them to the correction logic 124 which time aligns the converted signals of all stages to thereby generate the output digital signal. The residue signals between conversion stages are typically sampled before processing by succeeding stages.

In an application such as that of FIG. 3, the driver system 80 may be organized in various embodiments which can be investigated with reference to the LVDS driver 60 of FIG. 2 in which the transistors 31A, 32A, 33A and 34A and the feedback resistors 41 and 42 are considered to comprise a driver core 140.

In a first embodiment, each of the pairs 81 of pins of FIG. 3 would be driven by a respective driver core 140. The embodiment would include a single current source 44A that includes, for each of the driver cores 140, a low-level current tap (72 in FIG. 2) and a corresponding current mirror (74 in FIG. 2) which provides the requisite bridge current 46.

In this embodiment, a differential amplifier 82 (referenced to the band-gap voltage source (62 in FIG. 2) of the current source 44A and a corresponding coupling transistor 84 would be provided to each of the driver cores 140 to control its common-mode voltage level.

In a different second embodiment, the feedback resistors 41 and 42 would be removed from all but a single driver core 140. For this driver core, a single differential amplifier 82 and coupling transistor 84 would respond to the circuit junction 50 of the feedback resistors and control the common-mode level of this junction. Each of the other driver cores 140 would have a corresponding coupling transistor 84 whose gate is coupled to the output of the differential amplifier 82. Because of its individual feedback controls, the first embodiment is more resistant to voltage differentials across system ground planes.

Although the LVDS drivers of the invention may be realized with various transistors (e.g., bipolar junction transistors), it is noted that they are especially suited for realization with low-dissipation CMOS transistors.

As previously stated, resistor symbols have been used in FIGS. 1–3 to indicate LVDS loads because these loads are preferably resistive loads which are typically realized with resistors or with appropriately-biased semiconductor devices.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A low voltage differential signaling (LVDS) driver for driving differential currents through a load, comprising:

four current-steering switches that are serially-connected to form a circuit bridge that defines, between respective pairs of said switches, an upper terminal, a lower terminal and first and second side terminals between said upper and lower terminals;

first and second impedance elements serially connected between said first and second side terminals to provide a junction between said first and second impedance elements;

a current source that provides a current-source current only to a first selected terminal of said upper and lower terminals; and a feedback-controlled voltage source that receives a feedback signal from said junction and in response to a reference voltage, provides a control voltage only to a second selected terminal of said upper and lower terminals that maintains a junction voltage of said junction substantially equal to said reference voltage wherein said second selected terminal differs from said first selected terminal;

said load thereby receiving differential currents having magnitudes substantially equal to said current-source current when said load is coupled between said first and second side terminals and said switches respond to differential input signals; and said junction voltage thereby independent of the magnitude of said current-source current.

2. The driver of claim 1 wherein said current-steering switches are metal-oxide semiconductor transistors.

3. The driver of claim 1 wherein said current-steering switches are n-channel metal-oxide semiconductor transistors.

4. A low voltage differential signaling (LVDS) driver for driving differential current signals through a load, comprising:

first, second, third and fourth current-steering switches that are serially-connected to form a circuit bridge with said first and third switches respectively coupled to the top and bottom of a first side of said circuit bridge and said second and fourth switches respectively coupled to the top and bottom of a second side of said circuit bridge;

first and second substantially-equal resistors serially connected across said circuit bridge;

a current source coupled to provide a bridge current to one of the top and bottom of said circuit bridge; and a voltage source that, in response to a feedback signal from a circuit junction between said first and second resistors, provides a voltage to the other of the top and bottom of said circuit bridge that maintains said circuit junction at a common-mode level;

differential voltages that are substantially centered about said common-mode level are thereby generated when said load is coupled across said circuit bridge and differential first and second drive signals are respectively applied to said first and fourth switches and said second and third switches;

wherein said current source includes a selectable resistor and controls the magnitude of said bridge current in response to the resistance of said selectable resistor.

5. A low voltage differential signaling (LVDS) driver for driving differential current signals through a load, comprising:

first, second, third and fourth current-steering switches that are serially-connected to form a circuit bridge with said first and third switches respectively coupled to the top and bottom of a first side of said circuit bridge and said second and fourth switches respectively coupled to the top and bottom of a second side of said circuit bridge;

first and second substantially-equal resistors serially connected across said circuit bridge;

a current source coupled to provide a bridge current to one of the top and bottom of said circuit bridge; and a voltage source that, in response to a feedback signal from a circuit junction between said first and second resistors, provides a voltage to the other of the top and bottom of said circuit bridge that maintains said circuit junction at a common-mode level;

differential voltages that are substantially centered about said common-mode level are thereby generated when said load is coupled across said circuit bridge and differential first and second drive signals are respectively applied to said first and fourth switches and said second and third switches;

wherein said current source includes a band-gap-referenced voltage source that provides a band-gap voltage and said current source controls the magnitude of said bridge current in response to said band-gap voltage.

6. A low voltage differential signaling (LVDS) driver for driving differential current signals through a load, comprising:

first, second, third and fourth current-steering switches that are serially-connected to form a circuit bridge with said first and third switches respectively coupled to the top and bottom of a first side of said circuit bridge and said second and fourth switches respectively coupled to the top and bottom of a second side of said circuit bridge;

first and second substantially-equal resistors serially connected across said circuit bridge;

a current source coupled to provide a bridge current to one of the top and bottom of said circuit bridge; and a voltage source that, in response to a feedback signal from a circuit junction between said first and second resistors, provides a voltage to the other of the top and bottom of said circuit bridge that maintains said circuit junction at a common-mode level;

differential voltages that are substantially centered about said common-mode level are thereby generated when said load is coupled across said circuit bridge and differential first and second drive signals are respectively applied to said first and fourth switches and said second and third switches;

wherein said current source includes:
a selectable resistor Rsel;
a band-gap-referenced voltage source that provides a band-gap voltage; and a feedback-controlled amplifier that provides said bridge current in response to said band-gap voltage and the resistance of said selectable resistor Rsel.

7. A low voltage differential signaling (LVDS) driver for driving differential current signals through a load, comprising:

first, second, third and fourth current-steering switches that are serially-connected to form a circuit bridge with said first and third switches respectively coupled to the top and bottom of a first side of said circuit bridge and said second and fourth switches respectively coupled to the top and bottom of a second side of said circuit bridge;

first and second substantially-equal resistors serially connected across said circuit bridge;

a current source coupled to provide a bridge current to one of the top and bottom of said circuit bridge; and a voltage source that, in response to a feedback signal from a circuit junction between said first and second resistors, provides a voltage to the other of the top and bottom of said circuit bridge that maintains said circuit junction at a common-mode level;

differential voltages that are substantially centered about said common-mode level are thereby generated when said load is coupled across said circuit bridge and differential first and second drive signals are respectively applied to said first and fourth switches and said second and third switches;

wherein said current source includes:
a selectable resistor Rsel;
a band-gap-referenced voltage source that provides a band-gap voltage;
a differential amplifier that drives a bias current through said selectable resistor Rsel that generates a bias voltage and controls the magnitude of said bias current in response to the difference between said bias voltage and said band-gap voltage; and
a current mirror that provides said bridge current in response to said bias current;
the magnitude of said bridge current thereby determined by said selectable resistor Rsel.

8. The driver of claim 1 wherein said voltage source includes:

a common-mode voltage source that provides a common-mode voltage;

a coupling transistor coupled to said second selected terminal; and a differential amplifier that controls voltage across said coupling transistor in response to the difference between said junction voltage and said common-mode voltage.

9. A low voltage differential signaling (LVDS) driver for driving differential current signals through a load, comprising:

first, second, third and fourth current-steering switches that are serially-connected to form a circuit bridge with said first and third switches respectively coupled to the top and bottom of a first side of said circuit bridge and said second and fourth switches respectively coupled to the top and bottom of a second side of said circuit bridge;

first and second substantially-equal resistors serially connected across said circuit bridge;

a current source coupled to provide a bridge current to one of the top and bottom of said circuit bridge; and a voltage source that, in response to a feedback signal from a circuit junction between said first and second resistors, provides a voltage to the other of the top and bottom of said circuit bridge that maintains said circuit junction at a common-mode level;

differential voltages that are substantially centered about said common-mode level are thereby generated when said load is coupled across said circuit bridge and differential first and second drive signals are respectively applied to said first and fourth switches and said second and third switches;

wherein said current source includes:
  a selectable resistor Rsel;
  a band-gap-referenced voltage source that provides a band-gap voltage; and
  a feedback-controlled amplifier that provides said bridge current in response to said band-gap voltage and the resistance of said selectable resistor Rsel;
  and wherein said voltage source includes:
    a coupling transistor that couples a supply voltage to said circuit bridge; and
    a differential amplifier that controls voltage across said coupling transistor in response to the difference between said feedback signal and said band-gap voltage.

10. A low voltage differential signaling (LVDS) driver system for driving differential current signals through loads, comprising:

a plurality of circuit bridges that each include four current-steering switches that are serially-connected to define, between respective pairs of said switches, an upper terminal, a lower terminal and first and second side terminals between said upper and lower terminals;

for at least one of said circuit bridges, first and second impedance elements serially connected between first and second side terminals of that circuit bridge to provide a junction between said first and second impedance elements;

a current source that provides a current-source current to a first selected terminal of said upper and lower terminals of each of said circuit bridges; and at least one voltage source that receives a feedback signal from said junction and in response to a reference voltage, provides a control voltage only to a second selected terminal of said upper and lower terminals that maintains a junction voltage of said junction substantially equal to said reference voltage wherein said second selected terminal differs from said first selected terminal;

said loads thereby receiving differential currents having magnitudes substantially equal to said current-source current when said loads are coupled between respective first and second side terminals and said switches respond to differential input signals; and said junction voltage thereby independent of the magnitude of said current-source current.

11. The system of claim 10, further including, across each of said circuit bridges, respective serially connected first and second impedance elements and wherein said at least one voltage source comprises a plurality of voltage sources that each responds to a respective pair of said first and second impedance elements.

12. The system of claim 10 wherein said current-steering switches are metal-oxide semiconductor transistors.

13. The system of claim 10 wherein said current-steering switches are n-channel metal-oxide semiconductor transistors.

14. A low voltage differential signaling (LVDS) driver system for driving differential current signals through loads, comprising:

a plurality of circuit bridges that are each formed from first, second, third and fourth current-steering switches that are serially-connected to form a respective circuit bridge with said first and third switches respectively coupled to the top and bottom of a first side of said respective circuit bridge and said second and fourth switches respectively coupled to the top and bottom of a second side of said respective circuit bridge;

for at least one of said circuit bridges, first and second substantially-equal resistors serially connected across that circuit bridge;

a current source coupled to provide a bridge current to one of the top and bottom of each of said circuit bridges; and at least one voltage source that, in response to a feedback signal from a circuit junction between said first and second resistors, provides a voltage to the other of the top and bottom of each of said circuit bridges that maintains said circuit junction at a common-mode level;

differential voltages that are substantially centered about said common-mode level are thereby generated when each of said loads is coupled across a respective one of said circuit bridges and differential first and second drive signals are respectively applied to said first and fourth switches and said second and third switches of said respective circuit bridge;

wherein said current source includes a selectable resistor and controls the magnitude of said bridge current in response to the resistance of said selectable resistor.

15. A low voltage differential signaling (LVDS) driver system for driving differential current signals through loads, comprising:

a plurality of circuit bridges that are each formed from first, second, third and fourth current-steering switches that are serially-connected to form a respective circuit bridge with said first and third switches respectively coupled to the top and bottom of a first side of said respective circuit bridge and said second and fourth switches respectively coupled to the top and bottom of a second side of said respective circuit bridge;

for at least one of said circuit bridges, first and second substantially-equal resistors serially connected across that circuit bridge;

a current source coupled to provide a bridge current to one of the top and bottom of each of said circuit bridges; and at least one voltage source that, in response to a feedback signal from a circuit junction between said first and second resistors, provides a voltage to the other of the top and bottom of each of said circuit bridges that maintains said circuit junction at a common-mode level;

differential voltages that are substantially centered about said common-mode level are thereby generated when each of said loads is coupled across a respective one of said circuit bridges and differential first and second drive signals are respectively applied to said first and fourth switches and said second and third switches of said respective circuit bridge;

wherein said current source includes a band-gap-referenced voltage source that provides a band-gap voltage and said current source controls the magnitude of said bridge current in response to said band-gap voltage.

16. A low voltage differential signaling (LVDS) driver system for driving differential current signals through loads, comprising:

a plurality of circuit bridges that are each formed from first, second, third and fourth current-steering switches that are serially-connected to form a respective circuit bridge with said first and third switches respectively coupled to the top and bottom of a first side of said respective circuit bridge and said second and fourth switches respectively coupled to the top and bottom of a second side of said respective circuit bridge;

for at least one of said circuit bridges, first and second substantially-equal resistors serially connected across that circuit bridge;

a current source coupled to provide a bridge current to one of the top and bottom of each of said circuit bridges; and at least one voltage source that, in response to a feedback signal from a circuit junction between said first and second resistors, provides a voltage to the other of the top and bottom of each of said circuit bridges that maintains said circuit junction at a common-mode level;

differential voltages that are substantially centered about said common-mode level are thereby generated when each of said loads is coupled across a respective one of said circuit bridges and differential first and second drive signals are respectively applied to said first and fourth switches and said second and third switches of said respective circuit bridge;

wherein said current source includes:
a selectable resistor Rsel;
a band-gap-referenced voltage source that provides a band-gap voltage; and
a feedback-controlled amplifier that provides said bridge current in response to said band-gap voltage and the resistance of said selectable resistor Rsel.

17. A low voltage differential signaling (LVDS) driver system for driving differential current signals through loads, comprising:

a plurality of circuit bridges that are each formed from first, second, third and fourth current-steering switches that are serially-connected to form a respective circuit bridge with said first and third switches respectively coupled to the top and bottom of a first side of said respective circuit bridge and said second and fourth switches respectively coupled to the top and bottom of a second side of said respective circuit bridge;

for at least one of said circuit bridges, first and second substantially-equal resistors serially connected across that circuit bridge;

a current source coupled to provide a bridge current to one of the top and bottom of each of said circuit bridges; and at least one voltage source that, in response to a feedback signal from a circuit junction between said first and second resistors, provides a voltage to the other of the top and bottom of each of said circuit bridges that maintains said circuit junction at a common-mode level;

differential voltages that are substantially centered about said common-mode level are thereby generated when each of said loads is coupled across a respective one of said circuit bridges and differential first and second drive signals are respectively applied to said first and fourth switches and said second and third switches of said respective circuit bridge;

wherein said current source includes:
a selectable resistor Rsel;
a band-gap-referenced voltage source that provides a band-gap voltage;
a differential amplifier that drives a bias current through said selectable resistor Rsel that generates a bias voltage and controls the magnitude of said bias current in response to the difference between said bias voltage and said band-gap voltage; and
a current mirror that provides said bridge current in response to said bias current;
the magnitude of said bridge current thereby determined by said selectable resistor Rsel.

18. The system of claim 10 wherein said voltage source includes:
a common-mode voltage source that provides a common-mode voltage;
a coupling transistor coupled to said second selected terminal; and
a differential amplifier that controls voltage across said coupling transistor in response to the difference between said junction voltage and said common-mode voltage.

19. A low voltage differential signaling (LVDS) driver system for driving differential current signals through loads, comprising:

a plurality of circuit bridges that are each formed from first, second, third and fourth current-steering switches that are serially-connected to form a respective circuit bridge with said first and third switches respectively coupled to the top and bottom of a first side of said respective circuit bridge and said second and fourth switches respectively coupled to the top and bottom of a second side of said respective circuit bridge;

for at least one of said circuit bridges, first and second substantially-equal resistors serially connected across that circuit bridge;

a current source coupled to provide a bridge current to one of the top and bottom of each of said circuit bridges; and at least one voltage source that, in response to a feedback signal from a circuit junction between said first and second resistors, provides a voltage to the other of the top and bottom of each of said circuit bridges that maintains said circuit junction at a common-mode level;

differential voltages that are substantially centered about said common-mode level are thereby generated when each of said loads is coupled across a respective one of said circuit bridges and differential first and second drive signals are respectively applied to said first and fourth switches and said second and third switches of said respective circuit bridge;

wherein said current source includes:
a selectable resistor Rsel;
a band-gap-referenced voltage source that provides a band-gap voltage; and
a feedback-controlled amplifier that provides said bridge current in response to said band-gap voltage and the resistance of said selectable resistor Rsel;

and wherein said voltage source includes:
a coupling transistor that couples a supply voltage to said circuit bridge; and
a differential amplifier that controls voltage across said coupling transistor in response to the difference between said feedback signal and said band-gap voltage.

20. An analog-to-digital converter (ADC) system that delivers differential current signals to external loads, comprising:
an ADC that converts an analog input signal into differential digital output signals; and
a low voltage differential signaling (LVDS) driver system that drives differential current signals through each of said loads in response to respective ones of said digital output signals wherein said driver system includes;
a) a plurality of circuit bridges that are each formed from first, second, third and fourth current-steering switches that are serially-connected to form a respective circuit bridge with said first and third switches respectively coupled to the top and bottom of a first side of said respective circuit bridge and said second and fourth switches respectively coupled to the top and bottom of a second side of said respective circuit bridge;
b) for at least one of said circuit bridges, first and second substantially-equal resistors serially connected across that circuit bridge;
c) a current source coupled to provide a bridge current to one of the top and bottom of each of said circuit bridges; and
d) at least one voltage source that, in response to a feedback signal from a circuit junction between said first and second resistors, provides a voltage to the other of the top and bottom of each of said circuit bridges that maintains said circuit junction at a common-mode level;
differential voltages that are substantially centered about said common-mode level are thereby generated when each of said loads is coupled across a respective one of said circuit bridges and said differential digital output signals are differentially applied to said first and fourth switches and said second and third switches of said respective circuit bridge.

21. The system of claim 20, wherein said ADC is a successive approximation ADC.

22. The system of claim 20, wherein said ADC is a flash ADC.

23. The system of claim 20, wherein said ADC is a pipelined ADC.

24. The system of claim 20, wherein:
across each of said circuit bridges, respective serially connected first and second substantially-equal resistors; and
said at least one voltage source comprises a plurality of voltage sources that each responds to a respective feedback signal from a circuit junction between respective first and second resistors and each provides a voltage to the other of the top and bottom of a respective circuit bridge that maintains a respective circuit junction at said common-mode level.

25. The system of claim 20 wherein said current-steering switches are metal-oxide semiconductor transistors.

26. The system of claim 20 wherein said current-steering switches are n-channel metal-oxide semiconductor transistors.

27. The system of claim 20 wherein said current source includes a selectable resistor and controls the magnitude of said bridge current in response to the resistance of said selectable resistor.

28. The system of claim 20 wherein said current source includes a band-gap-referenced voltage source that provides a band-gap voltage and said current source controls the magnitude of said bridge current in response to said band-gap voltage.

29. The system of claim 20 wherein said current source includes:
a selectable resistor $R_{sel}$;
a band-gap-referenced voltage source that provides a band-gap voltage; and
a feedback-controlled amplifier that provides said bridge current in response to said band-gap voltage and the resistance of said selectable resistor $R_{sel}$.

30. The system of claim 20 wherein said current source includes:
a selectable resistor $R_{sel}$;
a band-gap-referenced voltage source that provides a band-gap voltage;
a differential amplifier that drives a bias current through said selectable resistor $R_{sel}$ that generates a bias voltage and controls the magnitude of said bias current in response to the difference between said bias voltage and said band-gap voltage; and
a current mirror that provides said bridge current in response to said bias current;
the magnitude of said bridge current thereby determined by said selectable resistor $R_{sel}$.

31. The system of claim 20 wherein said voltage source includes:
a common-mode voltage source that provides a common-mode voltage;
a coupling transistor that couples a supply voltage to said circuit bridge; and
a differential amplifier that controls voltage across said coupling transistor in response to the difference between said feedback signal and said common-mode voltage.

32. The system of claim 20 wherein said current source includes:
a selectable resistor $R_{sel}$;
a band-gap-referenced voltage source that provides a band-gap voltage; and
a feedback-controlled amplifier that provides said bridge current in response to said band-gap voltage and the resistance of said selectable resistor $R_{sel}$;
and wherein said voltage source includes:
a coupling transistor that couples a supply voltage to said circuit bridge; and
a differential amplifier that controls voltage across said coupling transistor in response to the difference between said feedback signal and said band-gap voltage.

33. The driver of claim 1 wherein said first and second impedance elements are first and second resistors.

34. The driver of claim 33 wherein said first and second resistors are substantially equal.

35. The driver of claim 1 wherein said differential signals are coupled to said switches in an arrangement that differentially couples said current-source current through said load.

36. The system of claim 10 wherein said first and second impedance elements are first and second resistors.

37. The system of claim 36 wherein said first and second resistors are substantially equal.

38. The system of claim 10 wherein said differential signals are coupled to said switches in an arrangement that differentially couples said current-source current through said load.

39. A low voltage differential signaling (LVDS) driver for driving differential current signals through a load, comprising:

first, second, third and fourth current-steering switches that are serially-connected to form a circuit bridge with said first and third switches respectively coupled to the top and bottom of a first side of said circuit bridge and said second and fourth switches respectively coupled to the top and bottom of a second side of said circuit bridge;

first and second resistors serially connected across said circuit bridge;

a current source coupled to provide a bridge current to one of the top and bottom of said circuit bridge; and a voltage source that, in response to a feedback signal from a circuit junction between said first and second resistors, provides a voltage to the other of the top and bottom of said circuit bridge that maintains said circuit junction at a common-mode level;

differential voltages that are substantially centered about said common-mode level are thereby generated when said load is coupled across said circuit bridge and differential first and second drive signals are respectively applied to said first and fourth switches and said second and third switches;

wherein said current source includes a selectable resistor and controls the magnitude of said bridge current in response to the resistance of said selectable resistor.

40. A low voltage differential signaling (LVDS) driver system for driving differential current signals through loads, comprising:

a plurality of circuit bridges that are each formed from first, second, third and fourth current-steering switches that are serially-connected to form a respective circuit bridge with said first and third switches respectively coupled to the top and bottom of a first side of said respective circuit bridge and said second and fourth switches respectively coupled to the top and bottom of a second side of said respective circuit bridge;

for at least one of said circuit bridges, first and second resistors serially connected across that circuit bridge;

a current source coupled to provide a bridge current to one of the top and bottom of each of said circuit bridges; and at least one voltage source that, in response to a feedback signal from a circuit junction between said first and second resistors, provides a voltage to the other of the top and bottom of each of said circuit bridges that maintains said circuit junction at a common-mode level;

differential voltages that are substantially centered about said common-mode level are thereby generated when each of said loads is coupled across a respective one of said circuit bridges and differential first and second drive signals are respectively applied to said first and fourth switches and said second and third switches of said respective circuit bridge;

wherein said current source includes a selectable resistor and controls the magnitude of said bridge current in response to the resistance of said selectable resistor.

* * * * *